(12) United States Patent
Fujimori

(10) Patent No.: US 7,091,599 B2
(45) Date of Patent: Aug. 15, 2006

(54) SOLID-STATE IMAGING DEVICE

(75) Inventor: Noriyuki Fujimori, Suwa (JP)

(73) Assignee: Olympus Corporation, Tokyo (JP)

( * ) Notice: Subject to any disclaimer, the term of this patent is extended or adjusted under 35 U.S.C. 154(b) by 252 days.

(21) Appl. No.: 10/740,347

(22) Filed: Dec. 18, 2003

(65) Prior Publication Data

US 2004/0130640 A1    Jul. 8, 2004

(30) Foreign Application Priority Data

Dec. 25, 2002  (JP) ............................. 2002-374301

(51) Int. Cl.
*H01L 23/48* (2006.01)

(52) U.S. Cl. ...................... 257/692; 257/693; 257/758; 257/E23.01; 257/E29.111; 348/76

(58) Field of Classification Search ................ 257/758, 257/692–693, 698, 784, E29.111, E23.01, 257/E23.012, 432–433; 348/76
See application file for complete search history.

(56) References Cited

U.S. PATENT DOCUMENTS

| 4,745,470 A | * | 5/1988 | Yabe et al. ................... 348/76 |
| 4,831,456 A | * | 5/1989 | Takamura ................... 348/374 |
| 5,424,573 A | * | 6/1995 | Kato et al. ................... 257/431 |
| 6,949,808 B1 | * | 9/2005 | Harazono ................... 257/433 |
| 7,012,282 B1 | * | 3/2006 | Mostafazadeh et al. ..... 257/100 |
| 2002/0057468 A1 | * | 5/2002 | Segawa et al. ............. 358/509 |

FOREIGN PATENT DOCUMENTS

| JP | 3-21859 | 3/1991 |
| JP | 5-268535 | 10/1993 |
| JP | 7-297226 | 11/1995 |
| JP | 8-148666 | 6/1996 |
| JP | 2001-224551 | 8/2001 |
| JP | 2001-339057 | 12/2001 |
| JP | 2002-231921 | 8/2002 |

* cited by examiner

*Primary Examiner*—Allan R. Wilson
(74) *Attorney, Agent, or Firm*—Scully, Scott, Murphy & Presser, P.C.

(57) ABSTRACT

A solid-state imaging device comprises a solid-state imaging element including a photo-reception portion and electrode pads, and optical glass bonded onto the solid-state imaging element through a bonding layer, wherein penetrating electrodes which reach the rear face of the solid-state imaging element are formed below the electrode pads of the solid-state imaging element.

5 Claims, 8 Drawing Sheets

SOLID-STATE IMAGING DEVICE

CROSS-REFERENCE TO RELATED APPLICATION

This application claims benefits of Japanese Application No. 2002-374301 filed in Japan on Dec. 25, 2002 the contents of which are incorporated by this reference.

BACKGROUND OF THE INVENTION

1. Field of the Invention

The present invention relates to a compact solid-state imaging device, an image pick-up device using the solid-state imaging device, an endoscope apparatus or capsule-type endoscope apparatus using the solid-state imaging device or the image pick-up device, and a method for manufacturing the solid-state imaging device.

2. Description of the Related Art

Conventionally, a solid-state imaging device of which an example is shown in FIG. 11 has been known. The solid-state imaging device shown in FIG. 11 has a solid-state imaging element chip 151, to which optical glass 152 has been glued, die-bonded to a ceramic substrate 154, with electrode pads 153 provided on the perimeter of the solid-state imaging element chip 151 and connecting pads 155 provided on the edge upper face of the ceramic substrate 154 electrically connected by wire bonding with bonding wire 156. The connecting pads 152 are electrically connected with external leads 157 within the ceramic substrate 154 by unshown wiring, thereby assembling a solid-state imaging device capable of driving solid-state imaging elements via the external leads 157 or acquiring photo-reception signals.

On the other hand, solid-state imaging devices used for medical-purpose endoscopes and the like must be small in size, in order to reduce the diameter of the insertion portion of the endoscope. FIG. 12 illustrates a plan view of the solid-state imaging device shown in FIG. 11, whereby it can be understood that solid-state imaging devices with such configurations consume a wide area for the region to perform wire bonding, which goes against the object of reducing diameter.

To deal with this, Japanese Unexamined Patent Application Publication No. 8-148666 proposes a solid-state imaging device whereby reduction in size is realized by means of a flexible board. FIG. 13 illustrates the solid-state imaging device disclosed in this Publication. In FIG. 13, electrode pads 164 which have bumps 170 provided on the perimeter of the imaging region 163 of the solid-state imaging element chip 161, and leads 173 on the flexible board 166, are connected using an anisotropic conductive film 165, and a transparent cap 168 is fixed on the upper face of the flexible board 166 using an adhesive resin 167. The portion of the flexible board 166 corresponding to the imaging region 163 of the solid-state imaging element chip 161 is cut out, thereby forming a space 174 between the solid-state imaging element chip 161 and the cap 168. This space 174 is sealed off by the anisotropic conductive film 165 and the adhesive resin 167.

According to the solid-state imaging device configured thus, the size thereof can be readily reduced while maintaining the same level of image pick-up properties and reliability.

However, the conventionally-proposed solid-state imaging device has the following problems. First, viewing this arrangement from above shows that the bent portion of the flexible board still requires a certain amount of area, which obstructs reducing in diameter. Further, there is the need to assemble the diced and separated optical sensor substrates (solid-state imaging element chips), the optical glass (cap), and the individual flexible boards, and moreover there is the need to bend the flexible boards back following assembly, resulting in very poor ease-of-assembly.

Also, at the time of assembly, separated parts need to be handled for at least the optical sensor substrates (solid-state imaging element chips) and the optical glass (cap), which is troublesome. Also, the photo-reception portion (imaging region) of the optical sensor substrate (solid-state imaging element chip) is often exposed to the ambient atmosphere, often leading to defective imaging due to foreign matter adhering to the photo-reception portion or drying marks of cleansing fluids and the like remaining on the photo-reception portion, which has been a factor in reducing yield.

Further, in recent years, there has been demand for reducing of the solid-state imaging device in the thickness direction, besides the reduction in the area as described above. In such cases, the optical sensor substrate can be mechanically, physically, or chemically polished, but the polishing must be performed supporting the photo-reception portion of the optical sensor substrate (solid-state imaging element chip), which also often leads to defective imaging due to foreign matter adhering to the photo-reception portion or drying marks of cleansing fluids and the like remaining on the photo-reception portion, and has been a factor in reducing yield.

The present invention has been made in order to solve the above-described problems of conventional solid-state imaging devices, and accordingly, it is an object of the present invention to provide a solid-state imaging device and a manufacturing method thereof suitable for mass-production, wherein both reduction in size and improved yield can be achieved, and excellent ease of assembly and work is realized.

SUMMARY OF THE INVENTION

In brief, the solid-state imaging device according to the present invention comprises: a solid-state imaging element including a photo-reception portion and electrode pads; and optical glass bonded onto the solid-state imaging element through a bonding layer; wherein penetrating electrodes which reach the rear face of the solid-state imaging element are formed below the electrode pads of the solid-state imaging element.

Additional features and advantages of the invention will be set forth in the description which follows, and in part will be obvious form the description, or may be learned by practice of the invention. The features and advantages of the invention may be realized and obtained by means of the instrumentalities and combinations particularly pointed out hereinafter.

DETAILED DESCRIPTION OF THE PREFERRED EMBODIMENTS

First Embodiment

Figure 1:
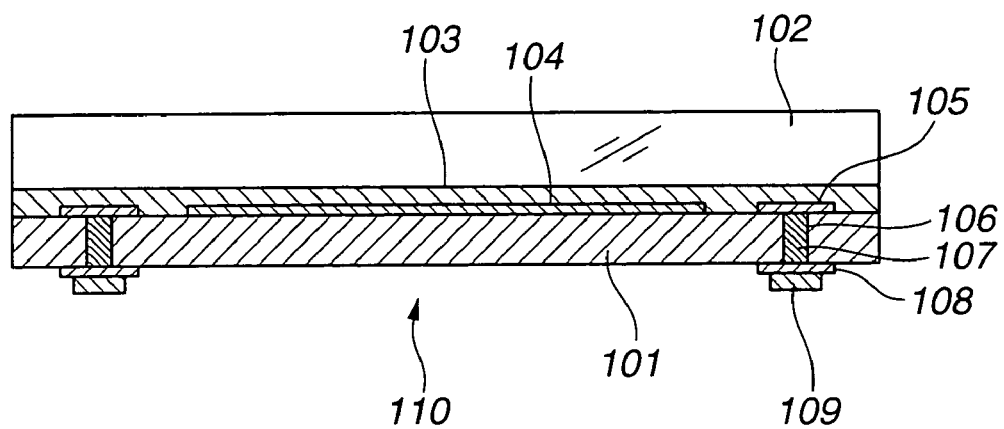
FIG. 1 is a cross-sectional view illustrating a solid-state imaging device according to a first embodiment of the present invention.

Now, the first embodiment of the present invention will be described. FIG. 1 is a cross-sectional view illustrating a solid-state imaging device according to the first embodiment. As shown in FIG. 1, a solid-state imaging element 101 including a photo-reception portion 104 and electrode pads 105 is glued to optical glass 102 through a bonding layer 103. The bonding layer 103 is formed on the entire bonding face, and is configured of an optically transparent material. Examples of the solid-state imaging element 101 here include CCDs, and also C-MOS or amplifying type imaging elements, as well. It is also needless to mention that microlenses or color filters or the like may be formed on the surface of the solid-state imaging element 101.

Examples of the optical glass which can be used include commonly-used glass material, quartz, crystal, and these materials coated with multi-coating or infrared-cutout coating or the like. As for the bonding layer 103, optically-transparent epoxy adhesive agent, low-melt glass, ultraviolet-hardening resin, or the like may be used. Also, while only the photo-reception portion 104 and the electrode pads 105 are shown in the solid-state imaging element 101, it is needless to mention that peripheral circuits may be formed, such as driving circuits or signals processing circuits or the like.

Penetrating electrodes 107 which are electrically connected to the electrode pads 105 and reach the rear face of the solid-state imaging element 101 are formed, and rear-face electrodes 108 are formed in electric connection with the penetrating electrodes 107 on the rear face of the solid-state imaging element 101 immediately beneath the electrode pads 105. Further, protruding electrodes 109 for electrical connections with external terminals are formed on the rear-face electrodes 108.

Figure 2:
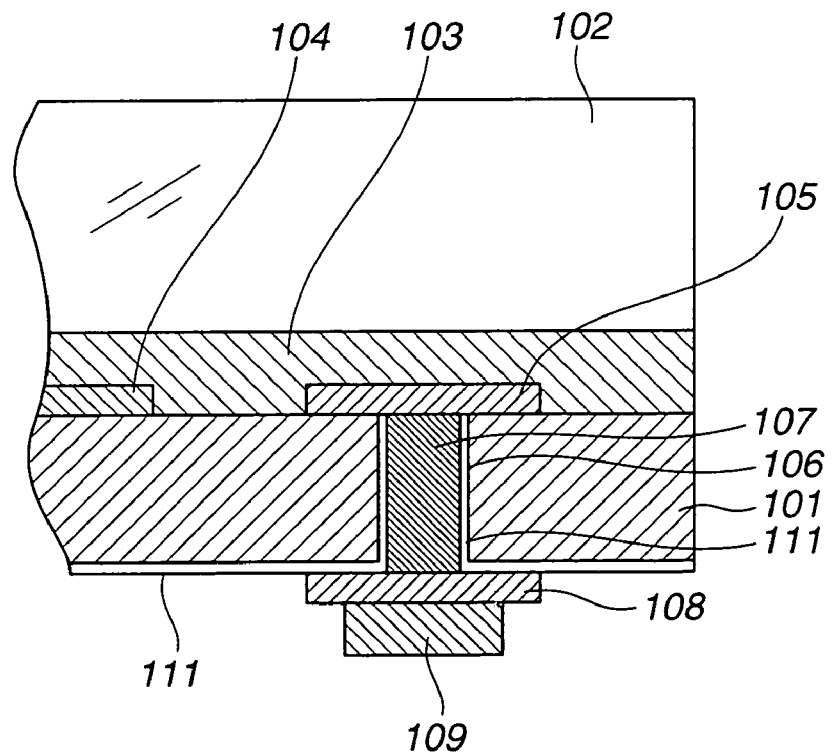
FIG. 2 is an enlarged cross-sectional view of principal portions of the solid-state imaging device according to the first embodiment.

FIG. 2 shows an enlarged drawing of around a penetrating electrode 107. The penetrating electrode 107 is formed by first forming a through hole 106, forming an insulating film 111 on the inner face thereof, and filling the inside thereof with metal or the like. Also, the insulating film 111 is formed on the entire rear face of the solid-state imaging element 101 other than the through holes 106, and the rear-face electrodes 108 and protruding electrodes 109 are layered on the penetrating electrodes 107, so as to be electrically connected to other devices or external terminals or the like. The penetrating electrodes 107 and rear-face electrodes 108 are electrically insulated from the inner face and rear face of the solid-state imaging element 101 due to the insulating film 111.

Figure 3:
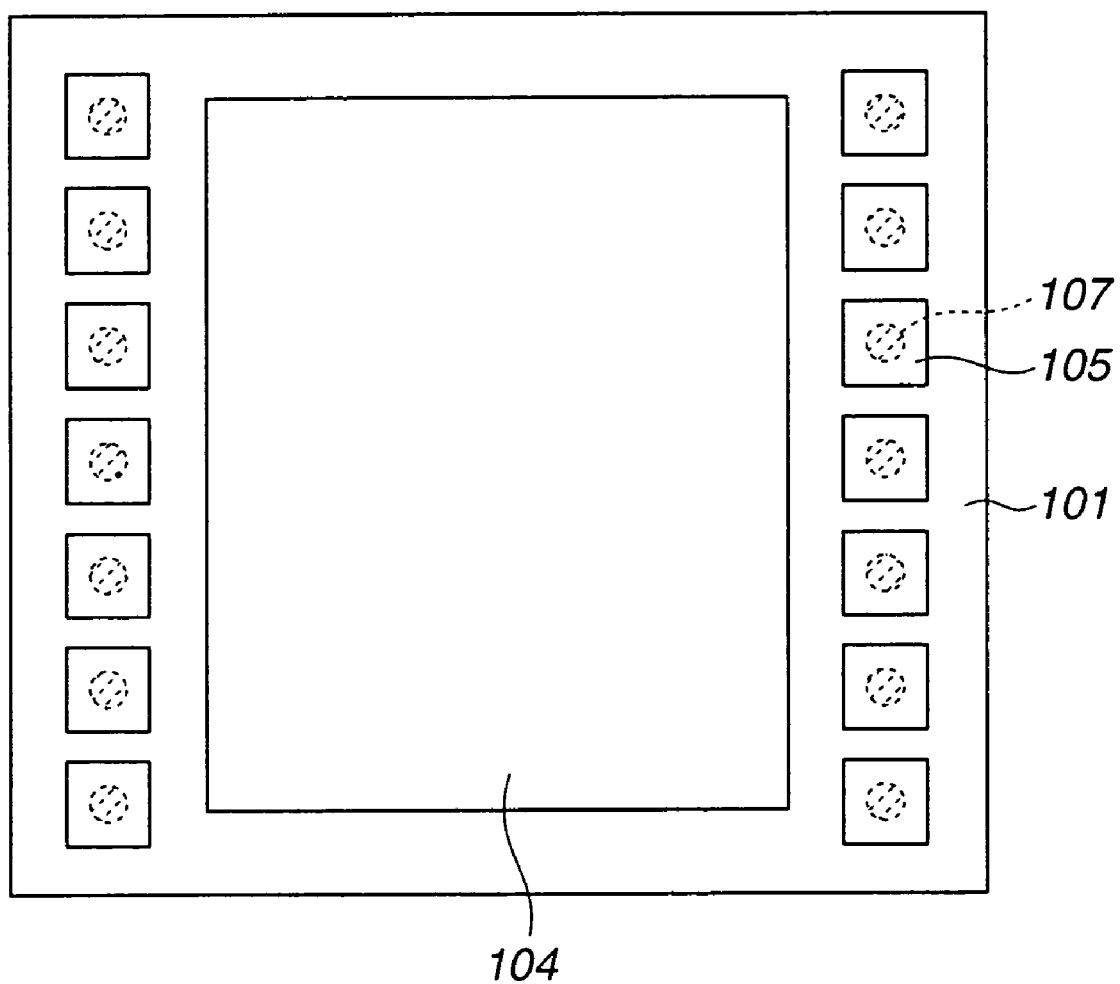
FIG. 3 is a plan view of the solid-state imaging device according to the first embodiment.

FIG. 3 is a see-though diagram viewing the solid-state imaging device shown in FIG. 1 from the front side thereof. As can be seen from the drawing, the penetrating electrodes 107 are positioned at the center of the electrode pads 105, and the outer diameter thereof is smaller than that of the electrode pads 105. TEOS (tetraethoxy silane) film, NSG (nondoped silicate glass) film, BPSG (boro-phospho-silicate glass) film, or organic resin film or the like may be used for the insulating film 111. Also, the protruding electrodes 109 may be formed of stud bumps of Au or Cu or the like formed by wire bonding, bumps of Au, Ag, Cu, In, solder or the like formed by plating, metal balls or metal-plated resin balls or electroconductive adhesive patterned by printing, and so forth. This so far has been a description of the configuration of the solid-state imaging device according to the first embodiment.

Figure 4A:
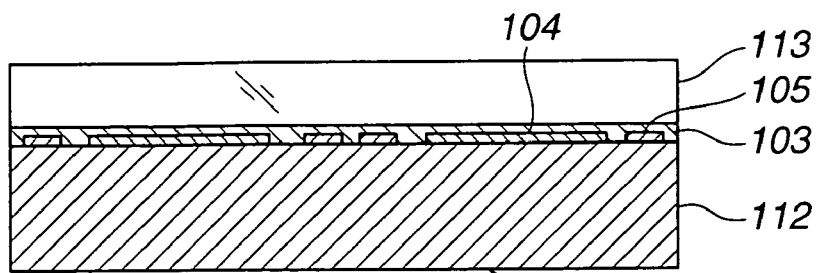
FIG. 4A is a manufacturing step diagram for explaining the manufacturing method of the solid-state imaging device according to the first embodiment.

Next will be described the method for manufacturing the solid-state imaging device according to the present embodiment. First, as shown in FIG. 4A, an optical glass wafer 113 is bonded onto a solid-state imaging element wafer 112 wherein multiple solid-state imaging element chips 101' have been formed on a silicone substrate. Note that reference numeral 104 denotes the photo-reception portion of the solid-state imaging element and 105 denotes the electrode pads, and the other components are omitted from the illustration. The thickness of the optical glass wafer 113 is determined by the image pick-up optical system to be combined with the solid-state imaging device, but generally is in the order of several tens of μm up to several mm.

As for the bonding step of the optical glass wafer 113, first, the optical glass wafer 113 is cleansed, and then coated with an adhesive agent, thereafter coated with adhesives, such as an epoxy adhesive, by spin coating. An example of a preferably-used adhesive is CYCLOTENE, which is a Registered Trademark of The Dow Chemical Company. The adhesive (bonding layer 103) should be coated to a thickness of around several μm to 50 μm, depending on the usage. Note that while the adhesive agent has been described as being coated onto the optical glass wafer 113, this may be formed on the silicon substrate (solid-state imaging element wafer) where the solid-state imaging element chips 101' are formed. Also, at the time of spin coating, either a normal open spin coating device or a closed spin coating device, wherein the coating portions are sealed off, may be used. Further, the method of applying the adhesive is not restricted to spin coating, and it is needless to say that printing may be used instead.

Next, following coating of the bonding layer 103, the optical glass wafer 113 is placed on a hot plate heated to 60° C. to 70° C. for 5 to 10 minutes, to semi-harden the bonding layer 103. The time and temperature for this is determined by the thickness of the bonding layer 103. Next, the solid-state imaging element wafer 112 and the optical glass wafer 113 are placed in a vacuum atmosphere, and the bonding layer 103 formed on the optical glass wafer 113 is pressed tight against the solid-state imaging element wafer 112. The solid-state imaging element wafer 112 and the optical glass wafer 113 may be aligned at this time if necessary. Or, the outer shape of the solid-state imaging element wafer 112 and the optical glass wafer 113 may be made to be almost the same, so that the two can be pressed against each other while matching the outer forms. This is because high-precision matching of the solid-state imaging elements 101 and optical glass 102 is not necessary.

Next, the temperature is raised to around 150° C. to 250° C., so as to completely harden the bonding layer 103. While the heating temperature and heating time depend on the thickness and area of the bonding layer 103, in the event that a micro-lens or color filter formed of an organic material is formed on the photo-reception portion 104 of the solid-state imaging element wafer 112, setting the bonding temperature low and the bonding time long is desirable since the capabilities of the micro-lens or color filter are not diminished. Also, a load may be applied to the bonding face while heating, to facilitate this bonding.

Finally, a bonded wafer 114, which is the composite article of the solid-state imaging element wafer 112 and the optical glass wafer 113, is gradually cooled, thereby completing the bonding step. According to this bonding step, the solid-state imaging element wafer 112 and the optical glass wafer 113 are pressed one against the other in a state of the bonding layer 103 being semi-hardened, and then subsequently completely hardened, so the bonding layer 103 can be made to follow the surface shapes (protrusions and recesses) formed on the surface of the solid-state imaging element wafer 112 such as the photo-reception portion 104 and the electrode pads 105 and so forth, and bonding defects do not readily occur.

Figure 4B:
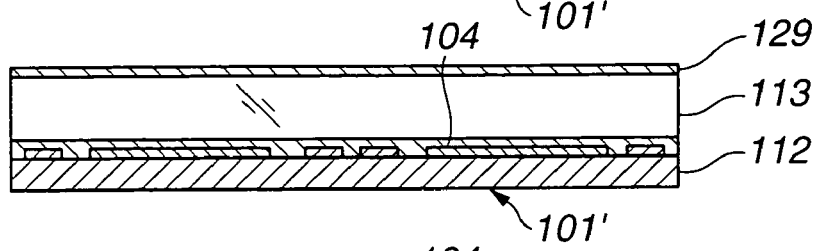
FIG. 4B is another manufacturing step diagram for explaining the manufacturing method of the solid-state imaging device according to the first embodiment.

Next, as shown in FIG. 4B, the optical glass wafer 113 is covered with a protective material formed of organic resin or the like, and the rear face of the solid-state imaging element wafer 112 is polished. The amount of polishing depends on the depth of element formation, such as of the photo-reception portion 104 of the solid-state imaging element wafer 112 and so forth, but with this example, the solid-state imaging element wafer 112 is polished down to 50 μm. For polishing, either mechanical polishing or chemical mechanical polishing may be used, or, wet etching wherein silicon is dissolved in an aqueous solution, or dry etching such as reactive ion etching or the like, may be used. Further, a combination of two or more polishing methods may be used. The polished face only needs to be polished to smoothness and surface roughness wherein the photolithography in the through hole and rear wiring formation steps described later can be performed without problem.

Thus, in the event of polishing the solid-state imaging element wafer 112, damage to the solid-state imaging element wafer 112 in the polishing step and in subsequent steps can be prevented by polishing following bonding of the solid-state imaging element wafer 112 with the optical glass wafer 113, and further, the article can be polished down to a thickness of around 50 μm. Also, the surface of the optical glass wafer 113 is covered with a protective material 129, so damage of the surface, and damage of the optical glass wafer or adhesion of foreign matter thereto can be prevented in the polishing step and in the subsequent steps. Scratches and foreign matter on the surface may be picked up by the image pick-up optical system, so this arrangement serves to prevent reduction in yield.

Figure 4C:
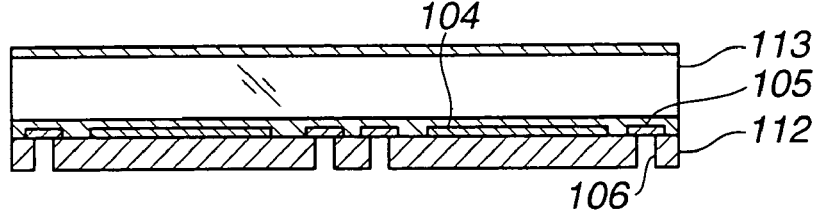
FIG. 4C is another manufacturing step diagram for explaining the manufacturing method of the solid-state imaging device according to the first embodiment.

Next, as shown in FIG. 4C, through holes 106 are formed below the electrode pads 105. Here, a mask pattern is formed on the rear side of the solid-state imaging element wafer 112 for the through holes 106 with resist using photolithography, following which the through holes 106 are formed by dry etching using RIE (reactive ion etching) or the like. At this time, the through hole mask pattern is formed using both-side alignment wherein the mask pattern is formed on the rear side of the solid-state imaging element wafer 112 taking the photo-reception portion 104 or the electrode pads 105 or the like on the front side of the solid-state imaging element wafer 112 as a reference. In the dry etching step, the electrode pads 105 or an insulating film (not shown) below the electrode pads serve as an etching-stop layer, and further, there is the bonding layer 103 above the electrode pads 105, so even inside an etching chamber which attains an almost complete vacuum, there is no difference in pressure, and damage to the electrode pads 105 can be prevented in a sure manner.

Also, with conventional manufacturing methods, attempting to form the through holes in the solid-state imaging element wafer alone resulted in the plasma generated in the dry etching step sometimes passing around to the photo-reception portion of the solid-state imaging element, resulting in deterioration of photo-reception capabilities, but with the manufacturing method according to the present embodiment, the device formation face where the photo-reception portion 104 and the electrode pads 105 and the like are situated on the solid-state imaging element wafer 112 is covered with the optical glass wafer 113 by the bonding layer 103, so there is no passing around of plasma to the photo-reception portion 104, and accordingly, the capabilities of the photo-reception portion 104 are not damaged.

Further, forming the through holes 106 after polishing down the thickness of the solid-state imaging element wafer 112 reduces the amount or distance to be etched in the dry etching step, which also enables time to be reduced here.

Following forming the through holes 106, a TEOS film is formed by plasma CVD on the inner face of the through holes 106 and on the rear face of the solid-state imaging element wafer 112. Note that while this TEOS film is formed on the entire inner face of the through holes 106, the portion in the through holes which is below the electrode pads 105 is selectively removed at a later stage.

Figure 4D:
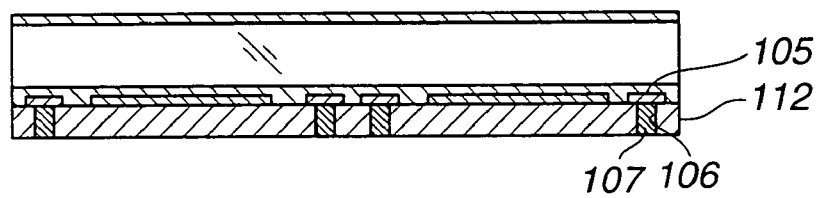
FIG. 4D is another manufacturing step diagram for explaining the manufacturing method of the solid-state imaging device according to the first embodiment.

Next, as shown in FIG. 4D, the penetrating electrodes 107 are formed on the inside of the through holes 106. Here, the penetrating electrodes 107 are formed by printing a nano-paste made up of gold or silver particles which are around 5 to 10 nm in diameter inside the through holes 106, and baking at a low temperature of around 100° C. to 200° C. Note that the penetrating electrodes 107 need not always be formed so as to fill the inside of the through holes 106, rather, an arrangement may be made wherein a conducting metal is formed only on the surface of the through holes 106 by non-electrolytic plating for example, with the inside thereof being filled with resin or the like later as necessary. Or, an electroconductive metal may be inserted into the through holes 106, thereby forming the penetrating electrodes 107.

Figure 4E:
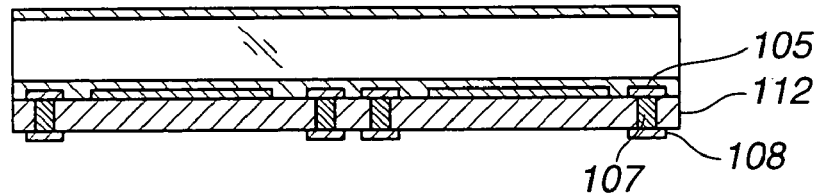
FIG. 4E is another manufacturing step diagram for explaining the manufacturing method of the solid-state imaging device according to the first embodiment.

Next, as shown in FIG. 4E, the rear-face electrodes 108 are formed corresponding to the penetrating electrodes 107. At the time of forming the rear-face electrodes 108, the entire rear face of the solid-state imaging element wafer 112 is covered with a film of metal such as aluminum or the like, following which the rear-face electrodes 108 are formed by photolithography. Here, both-side alignment is used for forming the rear-face electrodes 108, as with the earlier photolithography step, forming a mask pattern on the rear face of the solid-state imaging element wafer 112 by taking the photo-reception portion 104 or the electrode pads 105 or the like on the front side of the solid-state imaging element wafer 112 as a reference. Note that while aluminum is used here as the material for the rear-face electrodes 108, copper, gold, etc., may be used instead. On the other hand, the present embodiment involves rear-face electrodes 108 being provided at portions corresponding to the penetrating electrodes 107, the present invention is not restricted to this arrangement, and accordingly, an arrangement may be made wherein rear-face wiring is formed from the penetrating electrodes 107 to the rear face of the solid-state imaging element wafer 112, with rear-face electrodes being formed at optional positions on the rear-face wiring.

Figure 4F:
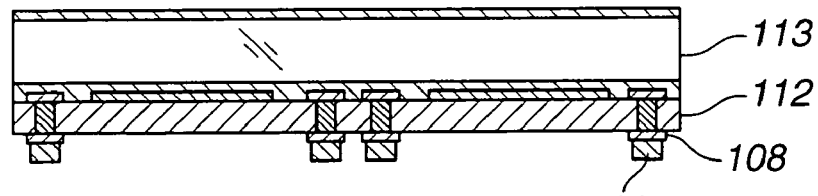
FIG. 4F is another manufacturing step diagram for explaining the manufacturing method of the solid-state imaging device according to the first embodiment.

Next, as shown in FIG. 4F, protruding electrodes 109 are formed on the rear-face electrodes 108. The protruding electrodes 109 are formed stud bumps of Au, Cu, etc., by wire bonding, bumps of Au, Ag, Cu, In, solder, etc., by plating, metal balls or metal-plated resin balls or electroconductive adhesive agent patterned by printing, or the like.

Note that while this arrangement involves the rear-face electrodes 108 being formed, and the protruding electrodes 109 being formed upon the rear-face electrodes 108, the present invention is by no means restricted to this arrangement, and it is needless to say that the protruding electrodes 109 may be directly formed on the penetrating electrode face or on rear-face wiring lines.

Figure 4G:
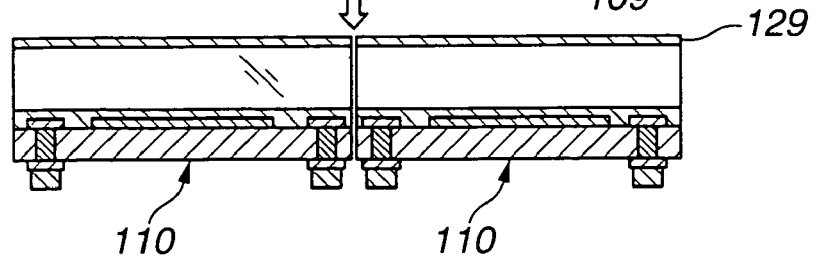
FIG. 4G is another manufacturing step diagram for explaining the manufacturing method of the solid-state imaging device according to the first embodiment.

Finally, as shown in FIG. 4G, the solid-state imaging element wafer 112 is diced along scribe lines (indicated by the arrow in the drawing), following which the protective material 129 on the surface of the optical glass wafer 113 is removed, thereby completing solid-state imaging devices 110. Of course, removal of the protective material 129 may be performed before dicing. Or, the protective material 129 may be removed following assembly into an image pick-up optical system or the like. Also, the bumps may be formed following dicing, as well.

According to the above-described configuration of the solid-state imaging device and the manufacturing method thereof, a solid-state imaging element substrate can be formed smaller with a simple manufacturing method, and further can be formed thinner, thereby realizing a solid-state imaging device which has small dimensions in the thickness direction as well, i.e., a chip-size-packaged solid-state imaging device. Also, through holes and penetrating electrodes can be formed in a short time with excellent controllability. Further, connection to other boards or the like can be easily made through the protruding electrodes, so applications to various types of apparatuses, such as the later-described endoscope for example, can be made.

On the other hand, the solid-state imaging elements and optical glass are assembled in the form of wafers, so assembly and workability are good, and there is no need to be concerned about adhesion of foreign matter or cleansing fluid to the photo-reception portion along the way, so solid-state imaging devices can be formed with excellent yield.

Second Embodiment

Figure 5:
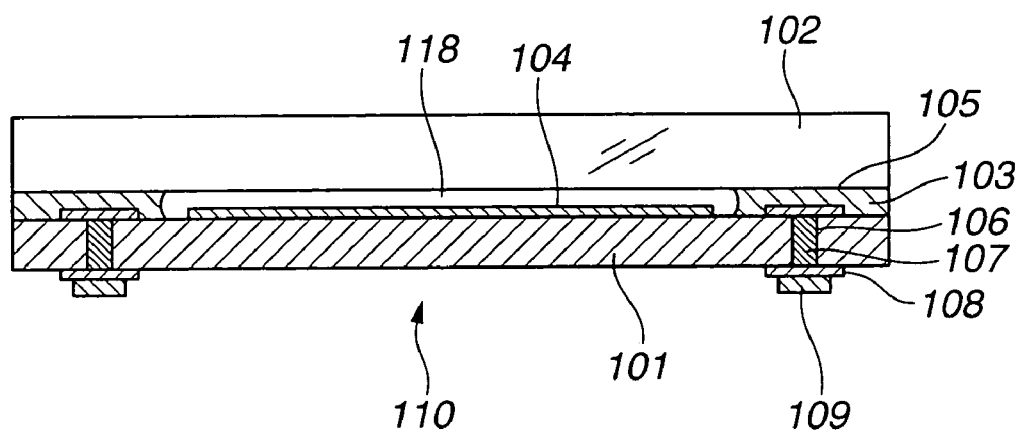
FIG. 5 is a cross-sectional view illustrating a solid-state imaging device according to a second embodiment of the present invention.

Next, the second embodiment of the present invention will be described. The basic configuration of the solid-state imaging device according to the second embodiment is the same as that of the first embodiment, the differing point being in that an airtight sealing portion is provided. FIG. 5 illustrates a cross-sectional diagram of the solid-state imaging device according to the present embodiment, and FIG. 6 illustrates a partial enlarged cross-sectional view thereof.

Figure 6:
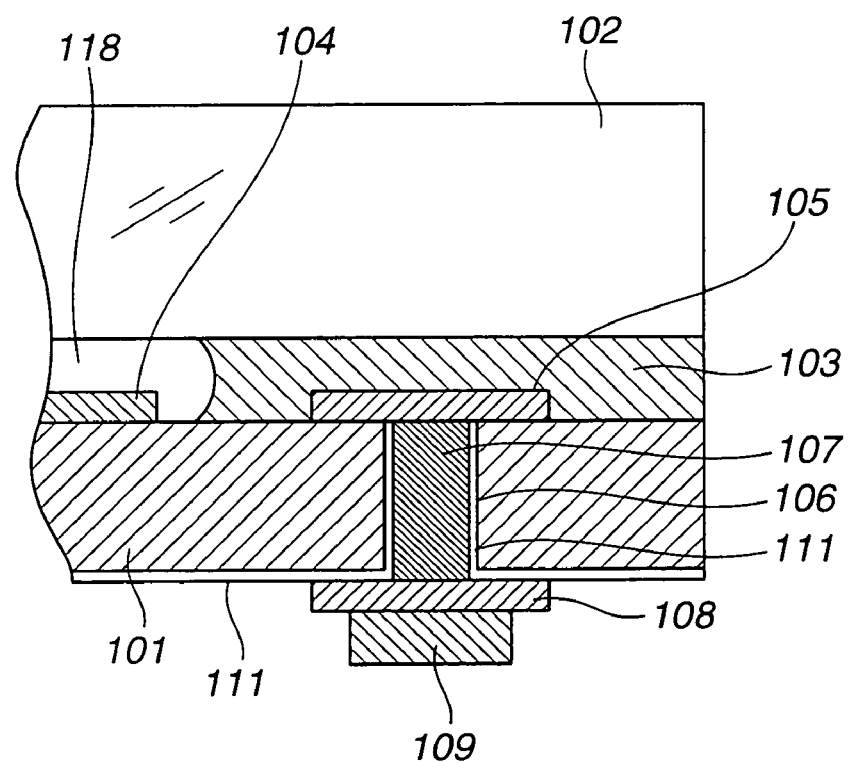
FIG. 6 is an enlarged cross-sectional view of principal portions of the solid-state imaging device according to the second embodiment.

As shown in FIGS. 5 and 6, the solid-state imaging element 101 including the photo-reception portion 104 and electrode pads 105 is glued to optical glass 102 through a bonding layer 103. Here, the bonding layer 103 is selectively formed only on the perimeter portion of the solid-state imaging element 101 excluding the photo-reception portion 104. That is to say, the solid-state imaging device is formed having an airtight sealing portion for airtight sealing of the photo-reception portion 104. This configuration is suitable for cases wherein a micro-lens formed of an organic material or a color filter is formed on the surface of the solid-state imaging element 101. That is to say, an air gap 118 is provided between the photo-reception portion 104 and the optical glass 102, so that the light condensing effects of the micro-lens can be improved.

Examples of the optical glass 102 which can be used include commonly-used glass material, quartz, crystal, and these materials coated with multi-coating or infrared-cutout coating or the like. As for the bonding layer 103, an organic material such as photosensitive epoxy resin or polyimide or the like is used in order to perform patterning as described later. Here, photosensitive CYCLOTENE, which is a Registered Trademark of The Dow Chemical Company, or NANO SU-8, which is a Registered Trademark of MicroChem Corp., is suitably used. Further, examples of the solid-state imaging element 101 here include CCDs, and also C-MOS or amplifying type imaging elements, as well. Also, while only the photo-reception portion 104 and the electrode pads 105 are shown in the solid-state imaging element 101, it is needless to mention that peripheral circuits may be formed, such as driving circuits or signals processing circuits or the like.

Other configurations are the same as those of the first embodiment, with penetrating electrodes 107 which are electrically connected to the electrode pads 105 and reach the rear face of the solid-state imaging element 101 being formed, and rear-face electrodes 108 being formed in electric connection with the penetrating electrodes 107 on the rear face of the solid-state imaging element 101 immediately beneath the electrode pads 105. Further, protruding electrodes 109 for electrical connections with external terminals are formed on the rear-face electrodes 108. The penetrating electrodes 107 are formed by first forming a through hole 106, forming an insulating film 111 on the inner face thereof, and filling the inside thereof with metal or the like.

Also, the insulating film 111 is formed on the entire rear face of the solid-state imaging element 101 other than the through holes 106, and the rear-face electrodes 108 and protruding electrodes 109 are layered on the penetrating electrodes 107, so as to be electrically connected to external terminals or the like. The penetrating electrodes 107 and rear-face electrodes 108 are electrically insulated from the inner face and rear face of the solid-state imaging element 101 due to the insulating film 111. TEOS film, NSG film, BPSG film, or organic resin film or the like may be used for the insulating film 111. Further, the penetrating electrodes 107 are positioned at the center of the electrode pads 105, and the outer diameter thereof is smaller than that of the electrode pads 105.

The manufacturing method of the solid-state imaging device according to the second embodiment is the same as that of the first embodiment except for the step for forming the bonding layer, so the bonding layer formation step alone will be described in brief. First, as with the case of the first embodiment, the optical glass wafer 113 is cleansed, and then the entire surface thereof is coated with photosensitive epoxy resin, which is to become the bonding layer 103, to a thickness of several μm to around 100 μm, by spin coating. Note that while the photosensitive epoxy resin is coated by spin coating, at the time of spin coating, either a normal open spin coating device or a closed spin coating device, wherein the coating portions are sealed off, may be used depending on the film thickness, as with the first embodiment. Next, the coated photosensitive epoxy resin is semi-hardened, patterned using photolithography, and exposed and developed.

Subsequently, the optical glass wafer and the solid-state imaging element wafer are aligned and bonded. At this time, performing bonding while purging with an inert gas such as nitrogen or the like in the vacuum atmosphere causes the inert gas to be filled in the inside of the air gap 118. This means that the organic material micro lens or color filter do not deteriorate as readily due to oxidization and the like, so reliability improves. Finally, the bonding layer (photosensitive epoxy resin layer) is completely hardened by heat.

While the heating temperature and heating time depend on the thickness and area of the bonding layer, in the event that a micro-lens or color filter formed of an organic material is formed on the photo-reception portion of the solid-state imaging element, setting the bonding temperature low and the bonding time long is desirable since the capabilities of the micro-lens or color filter are not diminished. Also, a load may be applied to the bonding face while heating, to facilitate this bonding. Thus, a bonding layer 103 is formed at a desired position. Here, the bonding layer 103 is formed only on the perimeter portion of the solid-state imaging element 101 excluding the photo-reception portion 104.

The bonding layer 103 may be colored black or a like color to shut out light, which would prevent unnecessary light from reaching the photo-reception portion 104 or the solid-state imaging element 101, thereby preventing adverse effects of stray light or reflection on the solid-state imaging element 101 and so forth. The conditions for forming the bonding layer 103 and so forth, such as temperature, are the same as those of the first embodiment. Other manufacturing steps are also the same as with the first embodiment.

According to the above-described manufacturing step, a solid-state imaging device having an airtight sealed portion can also be formed as a chip-size-packaged solid-state imaging device. Also, according to a solid-state imaging device with such a configuration, the same advantages as with the first embodiment can be obtained, as well as easily realizing a solid-state imaging device with improved light condensing effects of the micro-lens, due to having the airtight sealed portion.

Third Embodiment

Figure 7:
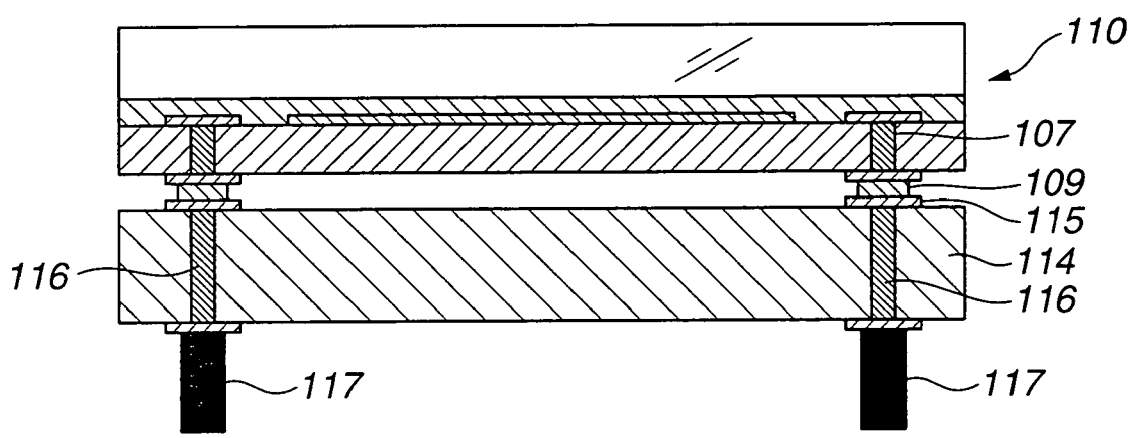
FIG. 7 is a cross-sectional view illustrating an image pick-up device according to a third embodiment of the present invention.
Figure 8:
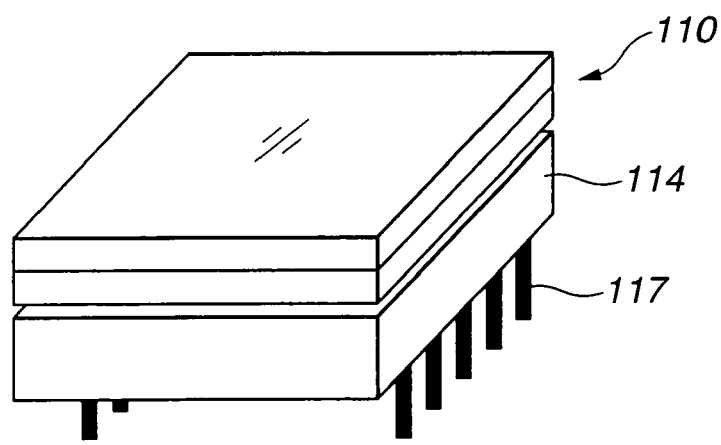
FIG. 8 is a perspective view of the image pick-up device according to the third embodiment.

Next, a third embodiment of the present invention will be described. The present embodiment relates to an image pick-up device wherein a solid-state imaging device according to the first or second embodiment is combined with another device. FIGS. 7 and 8 illustrate a cross-sectional diagram and perspective diagram of the image pick-up device according to the present embodiment.

With the image pick-up device according to the present embodiment, the solid-state imaging device 110 of the configuration described in the first or second embodiment is connected onto a module board 114 by the protruding electrodes 109 as shown in FIGS. 7 and 8. Surface electrodes 115 are formed on the module board 114, so the protruding electrodes 109 of the solid-state imaging device 110 are connected to the surface electrodes 115, and thereby electrically connected to the module board 114. Also, the module board 114 has penetrating electrodes 116 formed in the same way as the solid-state imaging device 110, with the penetrating electrodes 116 being connected to lead pins 117 for being electrically connected to external terminals. Now, the module board 114 comprises driving circuits and signal processing circuits and the like for the solid-state imaging device 110. Note that while the module board 114 has been illustrated with lead pins 117 being connected thereto, it is needless to say that electrodes may be formed on the lower side of the penetrating electrodes 116 or wiring and electrodes and the like may be formed, as with the solid-state imaging device 110, and that protruding electrodes may be further formed.

Figure 9:
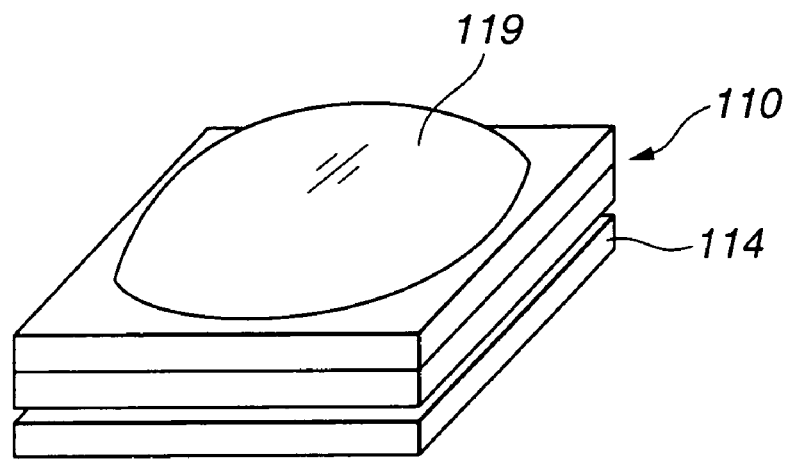
FIG. 9 is a perspective view illustrating a modification of the image pick-up device according to the third embodiment.
Figure 13:
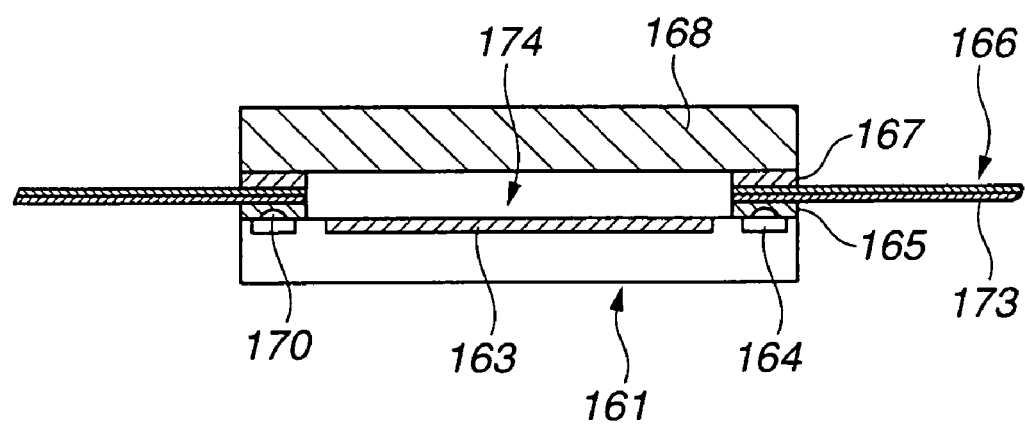
FIG. 13 is a cross-sectional view illustrating a configurational example of another conventional solid-state imaging device.

Further, as shown in FIG. 9, an image pick-up device may be configured by forming an optical element 119 such as a convex lens on the solid-state imaging device 110 connected to the module board 114. The optical element 119 has light condensing effects as to the photo-reception portion 104 of the solid-state imaging element 101. The optical element 119 may be formed by filling an ultraviolet-light hardening resin in a mold and irradiating ultraviolet rays, or a convex lens provided separately may be bonded onto the optical glass 102 which is a component of the solid-state imaging device. Also, the optical element 119 is not restricted to a convex lens, rather, combining the solid-state imaging device with a module board having a driving circuit and signals processing circuit and the like, and further forming an optical element such as a lens or the like thereupon, allows the image pick-up device to be formed in a compact manner, enabling applications to endoscope apparatuses, cellular telephones, etc., within which the article can be easily assembled. For example, using a modular board with a size equal to that of the solid-state imaging device or smaller, and mounting this in a medical endoscope device, allows the outer diameter of the endoscope insertion portion to be reduced drastically, thereby reducing the discomfort of the patient.

Note that while the present embodiment has been described with an optical element formed on a divided solid-state imaging device, an arrangement may be made wherein desired optical elements are formed on the optical glass wafer beforehand, assembled in wafer form along with the solid-state imaging element, and then diced to form the solid-state imaging devices having optical elements.

Fourth Embodiment

Next, a fourth embodiment of the present invention will be described. The present embodiment relates to a capsule-type endoscope apparatus wherein a solid-state imaging device or image pick-up device described in the first through third embodiments are applied to a capsule-type endoscope apparatus. The configuration of the capsule-type endoscope apparatus according to the present embodiment is shown in FIG. 10.

Figure 10:
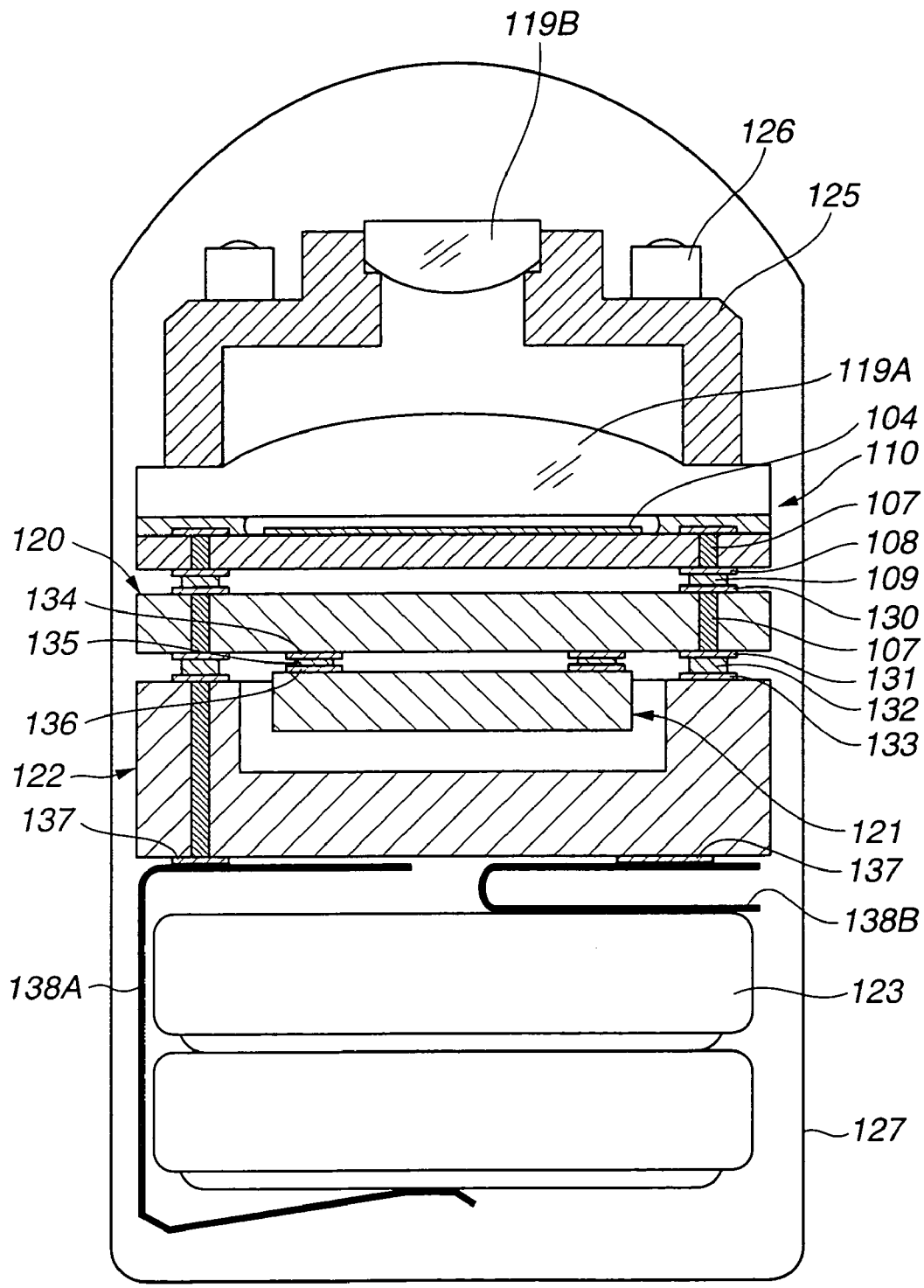
FIG. 10 is a cross-sectional view illustrating a capsule-type endoscope apparatus according to a fourth embodiment of the present invention.
Figure 11:
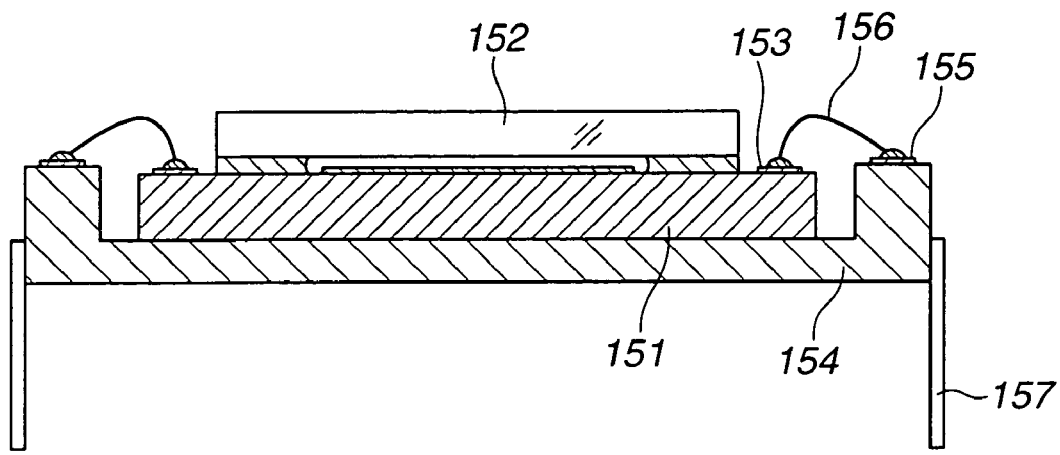
FIG. 11 is a cross-sectional view illustrating a configurational example of a conventional solid-state imaging device.
Figure 12:
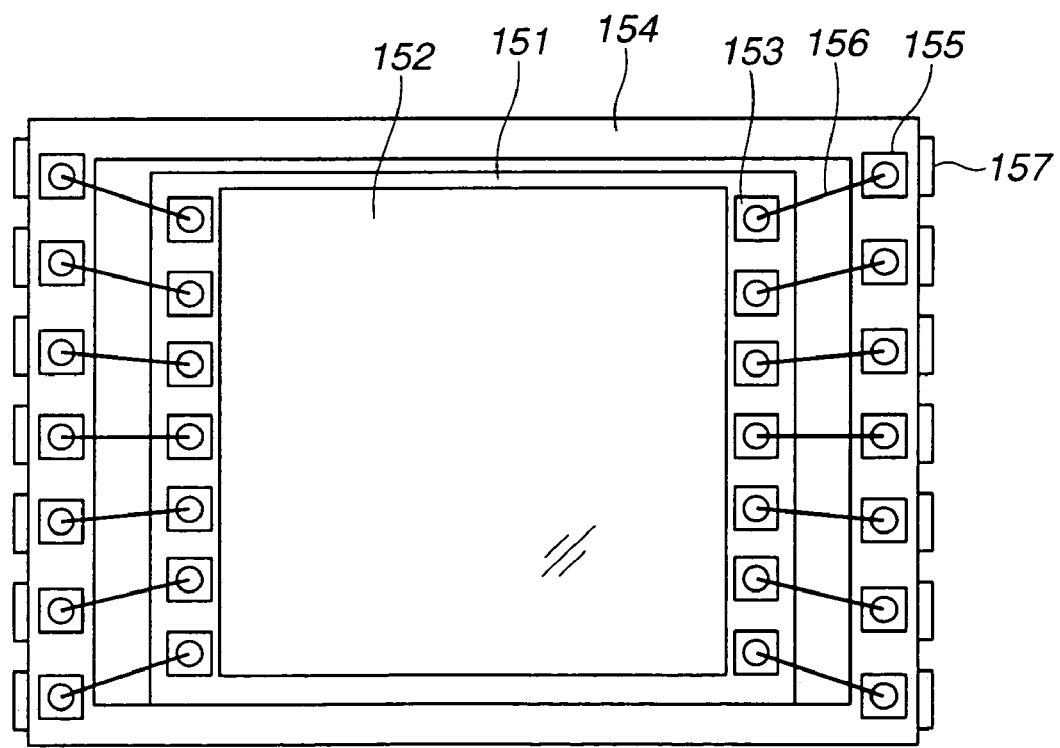
FIG. 12 is a plan view of the conventional solid-state imaging device shown in FIG. 11.

In FIG. 10, reference numeral 110 denotes the solid-state imaging device, 120 denotes an ASIC board for performing driving and signal processing of the solid-state imaging device 110, 121 a memory board, 122 a communication module board, 123 batteries, 119A an optical lens formed on the solid-state imaging device, 119B a convex lens, 125 a lens frame for holding the convex lens 119B, 126 an LED for illumination, and 127 an outer case. The solid-state imaging device upon which the optical lens such as described in the third embodiment is used for the solid-state imaging device here.

The solid-state imaging device 110 is connected to the electrode pads 130 on the ASIC board 120 through the protruding electrodes 109 formed on the rear-face electrodes 108, the ASIC board 120 is connected to mounting electrodes 133 on the communication module board 122 through protruding electrodes 132 formed on first rear-face electrodes 131, and also connected to electrode pads 136 of the memory board 121 through second rear-face electrodes 134 and protruding electrodes 135.

Now, an arrangement may be made wherein rear-face wiring is formed on the rear face of the solid-state imaging device 110, so as to connect the protruding electrodes on the rear-face wiring and the ASIC board 120. The ASIC board 120 may have penetrating electrodes and rear-face electrodes and the like formed for each electrode pad as with the solid-state imaging device 110, or may have penetrating electrodes and rear-face electrodes and the like formed on electrode pads as necessary, with rear-face wiring formed on the rear face of the board, thereby connecting to the communication module board 122 and the memory board 121.

The communication module board 122 has penetrating electrodes and rear-face wiring and the like formed as necessary, and is connected with battery springs 138A and 138B by electric power source electrodes 137 provided on the penetrating electrodes or rear-face wiring. The battery springs 138A and 138B are connected with batteries 123. The solid-state imaging device 110, ASIC board 120, memory board 121, and communication module board 122 can thus receive supply of electric power.

On the other hand, the lens frame 125 holding the convex lens 119B is glued to the solid-state imaging device 110, and a white-light LED is mounted on the lens frame 125 as an illumination light source. Further, the entirety is covered with an outer case 127 formed of an optically transparent resin which is electrically insulating, thereby forming the capsule-type endoscope apparatus.

Next, the operations of a capsule-type endoscope apparatus configured in this way will be described. First, an optical image passing through the optical lens 119A and convex lens 119B, which make up the image pick-up optical system, is subjected to photo-electric conversion at the solid-state imaging device 110, and the picture signals from the solid-state imaging device 110 are sent to the ASIC board 120. The picture signals are processed at the ASIC board 120, partly stored in the memory board 121 while being sent to the communication module board 122, and thereby transmitted to an unshown receiver outside of the human body. The receiver outside of the body can receive picture signals which the capsule-type endoscope apparatus has obtained, by wireless means. Accordingly, the inside of the human body can be examined through wireless means, by a subject swallowing the capsule-type endoscope apparatus.

Note that the ASIC board 120 also serves as a controller for the entire capsule-type endoscope apparatus, and also performs control of the white-light LED 126 which is the illumination means for image pick-up, control of the communication module 122, driving of the solid-state imaging device 110, and so forth. The electric power of the batteries 123 supplied to the communication module 122 is supplied to the ASIC board 120, the solid-state imaging device 110, and the while-light LED 126, so as to serve as the electric power source for each of these.

A capsule-type endoscope apparatus having such a configuration can be made very small in diameter, thereby reducing the discomfort of the subject. Also, a capsule-type endoscope apparatus which has excellent mass-produciblity can be provided.

As described above, according to the present invention, a solid-state imaging device which is small, has good controllability, has high yield and lends itself to mass-production, and has penetrating electrodes which are easily assembled, can be provided.

Further, the present invention is advantageous in that the solid-state imaging device can be readily electrically connected with other devices or external terminals in an optimal fashion, in that damage to the electrode pads can be prevented and penetrating electrodes with good controllability can be formed, in that a bonding layer can be formed which is optimal for the properties and use of the photo-reception portion of the solid-state imaging device, in that unnecessary light onto the photo-reception portion of the solid-state imaging element can be shielded, in that solid-state imaging devices capable of application to various types of apparatuses can be realized, and in that the solid-state imaging device according to the present invention can be used to easily configure various types of general-use image pick-up devices and endoscope apparatuses, and particularly very small capsule-type endoscope apparatuses which reduce the discomfort of the subject and yet can be mass-produced.

It should be noted that all embodiments which can be conceived as combinations of the above-described embodiments, in part or in whole, are encompassed by the scope of the present invention.

In this invention, it is apparent that working models different in a wide range can be formed on the basis of this invention without departing from the spirit and scope of the invention. This invention is not restricted by any specific embodiment except being limited by the appended Claims.

What is claimed is:

1. An image pick-up device comprises:
    a solid-state imaging element including
        a photo-reception portion and
        electrode pads; and
    optical glass bonded onto the solid-state imaging element through a bonding layer;
    wherein penetrating electrodes which reach the rear face of the solid-state imaging element are formed below the electrode pads of the solid-state imaging element;
    and wherein a rear-face wiring area is formed on the rear face of the solid-state imaging element, for electrical connection with the penetrating electrodes;
    and wherein rear-face electrodes are formed on the penetrating electrodes or the rear-face wiring area;
    and wherein protruding electrodes are formed on the penetrating electrodes, rear-face wiring area, or the rear-face electrodes;

and wherein connection is made to a module board of the same size or smaller than the image pick-up device, by the protruding electrodes.

2. An endoscope apparatus comprises:
a solid-state imaging element including
a photo-reception portion and
electrode pads; and
optical glass bonded onto the solid-state imaging element through a bonding layer;
wherein penetrating electrodes which reach the rear face of the solid-state imaging element are formed below the electrode pads of the solid-state imaging element;
and wherein a rear-face wiring area is formed on the rear face of the solid-state imaging element, for electrical connection with the penetrating electrodes;
and wherein rear-face electrodes are formed on the penetrating electrodes or the rear-face wiring area;
and wherein protruding electrodes are formed on the penetrating electrodes, rear-face wiring area, or the rear-face electrodes.

3. An endoscope apparatus comprises:
a solid-state imaging element including
a photo-reception portion and
electrode pads; and
optical glass bonded onto the solid-state imaging element through a bonding layer;
wherein penetrating electrodes which reach the rear face of the solid-state imaging element are formed below the electrode pads of the solid-state imaging element;
and wherein a rear-face wiring area is formed on the rear face of the solid-state imaging element, for electrical connection with the penetrating electrodes;
and wherein rear-face electrodes are formed on the penetrating electrodes or the rear-face wiring area;
and wherein protruding electrodes are formed on the penetrating electrodes, rear-face wiring area, or the rear-face electrodes;
and wherein connection is made to a module board of the same size or smaller than the solid-state imaging element, by the protruding electrodes.

4. A capsule-type endoscope apparatus comprises:
a solid-state imaging element including
a photo-reception portion and
electrode pads; and
optical glass bonded onto the solid-state imaging element through a bonding layer;
wherein penetrating electrodes which reach the rear face of the solid-state imaging element are formed below the electrode pads of the solid-state imaging element;
and wherein a rear-face wiring area is formed on the rear face of the solid-state imaging element, for electrical connection with the penetrating electrodes;
and wherein rear-face electrodes are formed on the penetrating electrodes or the rear-face wiring area;
and wherein protruding electrodes are formed on the penetrating electrodes, rear-face wiring area, or the rear-face electrodes.

5. A capsule-type endoscope apparatus comprises:
a solid-state imaging element including
a photo-reception portion and
electrode pads; and
optical glass bonded onto the solid-state imaging element through a bonding layer;
wherein penetrating electrodes which reach the rear face of the solid-state imaging element are formed below the electrode pads of the solid-state imaging element;
and wherein a rear-face wiring area is formed on the rear face of the solid-state imaging element, for electrical connection with the penetrating electrodes;
and wherein rear-face electrodes are formed on the penetrating electrodes or the rear-face wiring area;
and wherein protruding electrodes are formed on the penetrating electrodes, rear-face wiring area, or the rear-face electrodes;
and wherein connection is made to a module board of the same size or smaller than the solid-state imaging element, by the protruding electrodes.

* * * * *